United States Patent
Shih et al.

(10) Patent No.: US 12,013,641 B2
(45) Date of Patent: Jun. 18, 2024

(54) METHOD OF REDUCING UNDESIRED LIGHT INFLUENCE IN EXTREME ULTRAVIOLET EXPOSURE

(71) Applicant: TAIWAN SEMICONDUCTOR MANUFACTURING COMPANY, LTD., Hsinchu (TW)

(72) Inventors: Chih-Tsung Shih, Hsinchu (TW); Chen-Ming Wang, Kaohsiung (TW); Yahru Cheng, Taipei (TW); Bo-Tsun Liu, Taipei (TW); Tsung Chuan Lee, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/875,282

(22) Filed: Jul. 27, 2022

(65) Prior Publication Data
US 2022/0373890 A1    Nov. 24, 2022

Related U.S. Application Data

(62) Division of application No. 16/663,237, filed on Oct. 24, 2019, now Pat. No. 11,703,762.

(60) Provisional application No. 62/753,910, filed on Oct. 31, 2018.

(51) Int. Cl.
| G03F 7/11 | (2006.01) |
| G03F 7/16 | (2006.01) |
| G03F 7/20 | (2006.01) |
| G03F 7/38 | (2006.01) |

(52) U.S. Cl.
CPC ............... *G03F 7/11* (2013.01); *G03F 7/168* (2013.01); *G03F 7/2004* (2013.01); *G03F 7/38* (2013.01)

(58) Field of Classification Search
CPC ...... G03F 7/11; G03F 7/2004; G03F 7/70308; G03F 7/70575
See application file for complete search history.

(56) References Cited

U.S. PATENT DOCUMENTS

| 9,568,821 B2 | 2/2017 | Hatakeyama et al. |
| 10,670,955 B2 | 6/2020 | Oshemkov et al. |
| 2007/0231751 A1 | 10/2007 | Bristol et al. |

(Continued)

FOREIGN PATENT DOCUMENTS

| TW | 201543168 A | 11/2015 |
| TW | 201606439 A | 2/2016 |
| TW | 201706726 A | 2/2017 |

OTHER PUBLICATIONS

Non-Final Office Action issued in U.S. Appl. No. 16/663,237, dated May 11, 2022.

(Continued)

*Primary Examiner* — Daborah Chacko-Davis
(74) *Attorney, Agent, or Firm* — STUDEBAKER & BRACKETT PC (57) ABSTRACT

A method of generating a layout pattern includes disposing a photoresist layer of a resist material on a substrate and disposing a top layer over of the photoresist layer. The top layer is transparent for extreme ultraviolet (EUV) radiation and the top layer is opaque for deep ultraviolet (DUV) radiation. The method further includes irradiating the photoresist layer with radiation generated from an EUV radiation source. The radiation passes through the top layer to expose the photoresist layer.

20 Claims, 8 Drawing Sheets

(56) References Cited

U.S. PATENT DOCUMENTS

2015/0085268 A1     3/2015   Lu et al.
2017/0205704 A1     7/2017   Nikipelov et al.

OTHER PUBLICATIONS

Final Office Action issued in U.S. Appl. No. 16/663,237, dated Nov. 22, 2022.

METHOD OF REDUCING UNDESIRED LIGHT INFLUENCE IN EXTREME ULTRAVIOLET EXPOSURE

PRIORITY CLAIM AND CROSS-REFERENCE

This Divisional application claims priority to U.S. application Ser. No. 16/663,237 filed on Oct. 24, 2019, which claims priority to U.S. Provisional Application No. 62/753,910 filed on Oct. 31, 2018, the entire disclosure of the two applications are incorporated herein by reference.

BACKGROUND

During an integrated circuit (IC) design, a number of layout patterns of the IC, for different steps of IC processing, are generated. The layout patterns include geometric shapes corresponding to structures to be fabricated on a wafer. The layout patterns may be patterns on a mask that are projected, e.g., imaged, on a photoresist layer on the wafer to create the IC. A lithography process transfers the pattern of the mask to the photoresist layer of the wafer such that etching, implantation, or other steps are applied only to predefined regions of the wafer. Transferring the pattern of the mask to the photoresist layer may be performed by extreme ultraviolet (EUV) radiation to expose the photoresist layer of the wafer. The source that generates the EUV radiation, the EUV radiation source/the EUV light source, may also generate radiation that include out-of-band wavelengths, especially in the deep ultraviolet (DUV) range. The out-of-band DUV radiation of the EUV light source may become more profound during imaging, for example, when a pellicle is used on a reflective mask because the out-of-band DUV radiation is mostly reflected by the pellicle. Also, the out-of-band DUV radiation of the EUV light source can degrade focusing of the mask on the wafer because the focusing system is designed to create a focused image of the layout pattern using the EUV radiation. Thus, an additional exposure by the out-of-band DUV radiation of the EUV light source may create a blurred image of the layout pattern and thus may degrade the critical dimension (CD) uniformity. An efficient process is desirable without affecting the EUV radiation, to remove the out-of-band DUV radiation from the radiation generated by the EUV light source before the radiation generated by the EUV light source reaches the photoresist material to improve CD uniformity.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, a pellicle is placed over a reflective reticle (photo mask) to protect the reticle from contamination and to prevent an image of particles from being focused on the wafer. The pellicle is about a 25 nm to about 125 nm thick layer of material that is transparent to extreme ultraviolet light. In some embodiments, the pellicle is made of SiC, polysilicon, silicon nitride, or graphene. The pellicle, however, has a drawback in that it reflects DUV radiation. Therefore, when a reflective mask is used, the out-of-band DUV radiation generated by the EUV light source is reflected towards the photoresist coated substrate. Because most EUV photoresists are also sensitive to out-of-band DUV radiation, the longer wavelength DUV radiation (longer than EUV radiation) that is reflected off of the pellicle towards the photoresist coated substrate is added as a uniform, e.g., slow varying, bias to the energy exposed the photoresist material. The added bias to the energy exposing the photoresist material will degrade the critical dimension (CD) uniformity in some embodiments. Additionally, an imaging system designed to focus EUV radiation reflected off of a mask onto a wafer may not focus out-of-band DUV radiation reflected off the same mask and may cause further degradation of the critical dimension uniformity. The degradation is more profound with image features whose size and/or separation approach the resolution limit of the EUV radiation source of lithography.

To suppress the effects of the out-of-band DUV radiation, in some embodiments, a thin layer as a spectral filter is placed over the substrate to absorb the out-of-band DUV radiation. In some embodiments, the thin layer, which can be a top coating (TC) layer, is placed over the photoresist that is deposited on the wafer to absorb the out-of-band DUV radiation and, thus, to prevent the out-of-band DUV radiation from reaching the photoresist but allow EUV radiation to reach the photoresist. In some embodiments, a thin layer of TC as a spectral filter is placed over the substrate to prevent the out-of-band DUV radiation from passing through the top coating layer. In some embodiments, the thin layer has a specific thickness, based on a specific wavelength in the wavelength range of the out-of-band DUV radiation such that the thin layer performs as a stop filter for the specific wavelength and around the specific wavelength. Thus, by using the TC layer on the photoresist layer, a sharp image of the pattern on the mask is produced on the photoresist in some embodiments.

Figure 1:
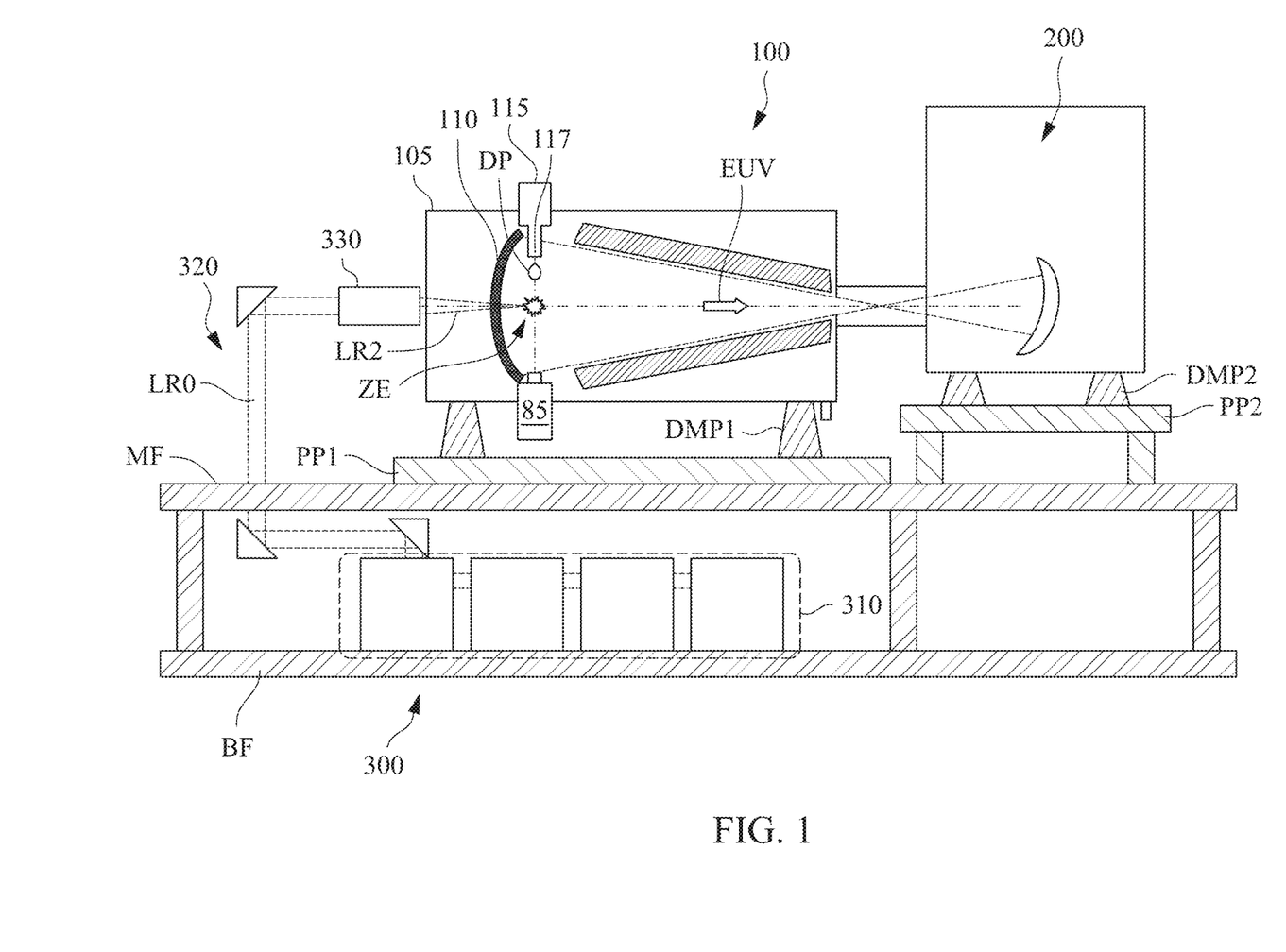
FIG. 1 shows a schematic view of an extreme ultraviolet (EUV) lithography system with a laser produced plasma (LPP) EUV radiation source in accordance with some embodiments of the present disclosure.

FIG. 1 shows a schematic view of an EUV lithography system with a laser produced plasma (LPP) EUV radiation source in accordance with some embodiments of the present disclosure. The EUV lithography system includes an EUV radiation source 100 (an EUV light source) to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DMP1 and DMP2, respectively. The EUV radiation source 100 and the exposure device 200 are coupled to each other by a coupling mechanism, which may include a focusing unit.

The lithography system is an EUV lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optical components, such as convex/concave/flat mirrors, a mask holding mechanism including a mask stage, and wafer holding mechanism. The EUV radiation generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss. The exposure device 200 is described in more details with respect to FIG. 2.

In the present disclosure, the terms mask, photomask, and reticle are used interchangeably. In addition, the term resist and photoresist are used interchangeably. In some embodiments, the mask is a reflective mask. In some embodiments, the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The exposure device 200 includes a projection optics module for imaging the pattern of the mask on to a semiconductor substrate with a resist coated thereon secured on a substrate stage of the exposure device 200. The projection optics module generally includes reflective optics. The EUV radiation (EUV light) directed from the mask, carrying the image of the pattern defined on the mask, is collected by the projection optics module, thereby forming an image on the resist.

In various embodiments of the present disclosure, the semiconductor substrate is a semiconductor wafer, such as a silicon wafer or other type of wafer to be patterned. The semiconductor substrate is coated with a resist layer sensitive to the EUV light in presently disclosed embodiments. Various components including those described above are integrated together and are operable to perform lithography exposing processes. The lithography system may further include other modules or be integrated with (or be coupled with) other modules.

As shown in FIG. 1, the EUV radiation source 100 includes a droplet generator 115 and a LPP collector mirror 110, enclosed by a chamber 105. The droplet generator 115 generates a plurality of target droplets DP, which are supplied into the chamber 105 through a nozzle 117. In some embodiments, the target droplets DP are tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, each having a diameter of about 10 μm, about 25 μm, about 50 μm, or any diameter between these values. In some embodiments, the target droplets DP are supplied through the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the nozzle 117 and into a zone of excitation ZE (e.g., a target droplet location) at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds.

The excitation laser beam LR2 generated by the excitation laser source 300 is a pulsed beam. The laser pulses of laser beam LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 μm or 10.6 μm in an embodiment. The laser light beam LR0 generated by the excitation laser source 300 is guided by the laser guide optics 320 and focused, by the focusing apparatus 330, into the excitation laser beam LR2 that is introduced into the EUV radiation source 100. In some embodiments, in addition to $CO_2$ and Nd:YAG lasers, the laser beam LR2 is generated by a gas laser including an excimer gas discharge laser, helium-neon laser, nitrogen laser, transversely excited atmospheric (TEA) laser, argon ion laser, copper vapor laser, KrF laser or ArF laser; or a solid state laser including Nd:glass laser, ytterbium-doped glasses or ceramics laser, or ruby laser. In some embodiments, a non-ionizing laser beam LR1 is also generated by the excitation laser source 300 and the laser beam LR1 is also focused by the focusing apparatus 330.

In some embodiments, the excitation laser beam LR2 includes a pre-heat laser pulse and a main laser pulse. In such embodiments, the pre-heat laser pulse (interchangeably referred to herein as the "pre-pulse) is used to heat (or pre-heat) a given target droplet to create a low-density target plume with multiple smaller droplets, which is subsequently heated (or reheated) by a pulse from the main laser (main pulse), generating increased emission of EUV light compared to when the pre-heat laser pulse is not used.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser beam LR2 is matched with the ejection-frequency of the target droplets DP in an embodiment.

The laser beam LR2 is directed through windows (or lenses) into the zone of excitation ZE. The windows adopt a suitable material substantially transparent to the laser beams. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation, which is collected by the collector mirror 110. The collector mirror 110, an EUV collector mirror, further reflects and focuses the EUV radiation for the lithography exposing processes performed through the exposure device 200. A droplet DP that does not interact with the laser pulses is captured by the droplet catcher 85.

One method of synchronizing the generation of a pulse (either or both of the pre-pulse and the main pulse) from the excitation laser with the arrival of the target droplet in the zone of excitation is to detect the passage of a target droplet at given position and use it as a signal for triggering an excitation pulse (or pre-pulse). In this method, if, for example, the time of passage of the target droplet is denoted by $t_o$, the time at which EUV radiation is generated (and detected) is denoted by $t_{rad}$, and the distance between the position at which the passage of the target droplet is detected and a center of the zone of excitation is d, the speed of the target droplet, $v_{dp}$, is calculated as $$v_{ap}=d/(t_{rad}-t_o) \quad \text{equation (1)}$$

Because the droplet generator 115 is expected to reproducibly supply droplets at a fixed speed, once $v_{dp}$ is calculated, the excitation pulse is triggered with a time delay of $d/v_{dp}$ after a target droplet is detected to have passed the given position to ensure that the excitation pulse arrives at the same time as the target droplet reaches the center of the zone of excitation. In some embodiments, because the passage of the target droplet is used to trigger the pre-pulse, the main pulse is triggered following a fixed delay after the pre-pulse. In some embodiments, the value of target droplet speed $v_{dp}$ is periodically recalculated by periodically measuring $t_{rad}$, if needed, and the generation of pulses with the arrival of the target droplets is resynchronized.

Figure 2:
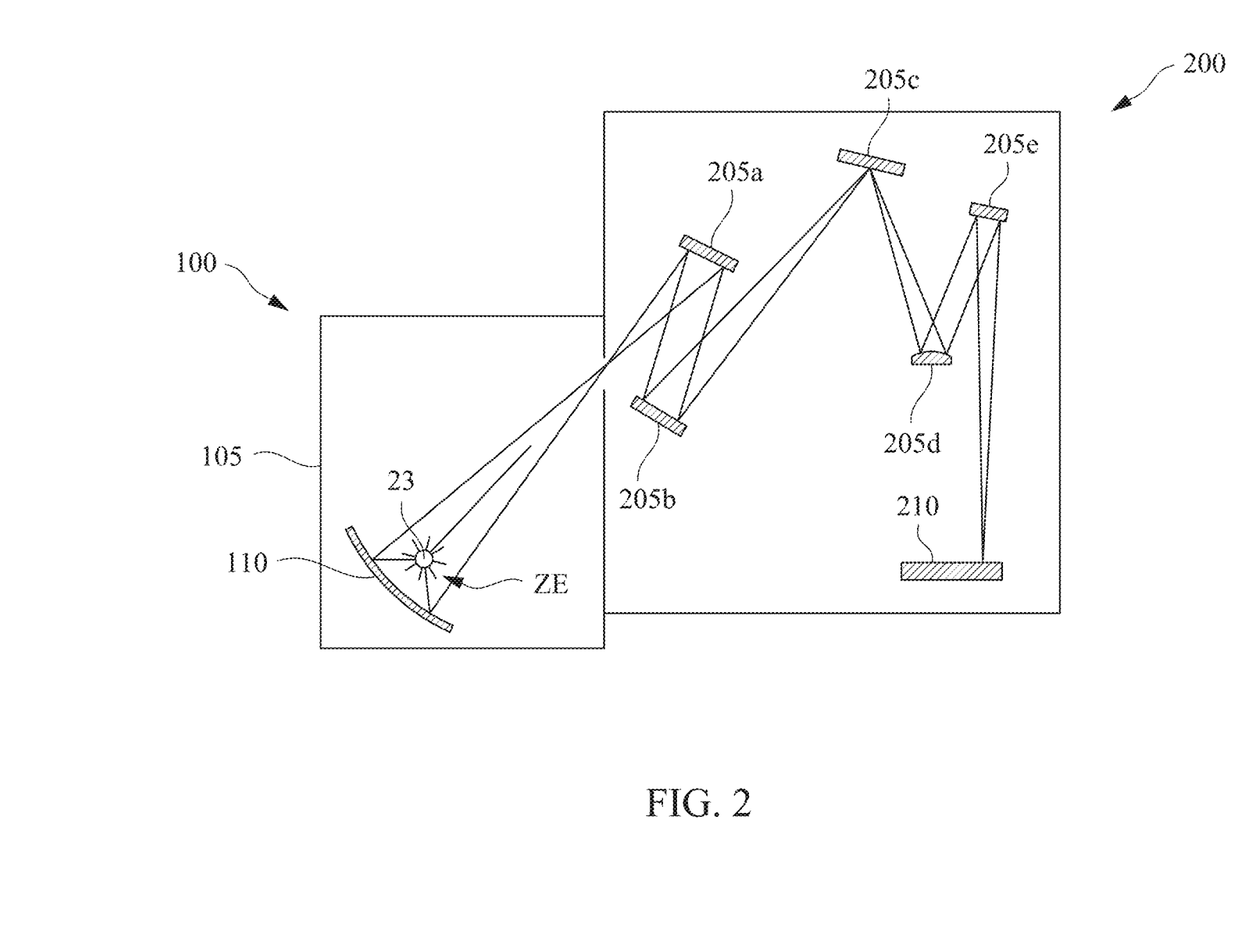
FIG. 2 shows a schematic view of an EUV lithography exposure tool in accordance with some embodiments of the present disclosure.

FIG. 2 shows a schematic view of an EUV lithography exposure tool in accordance with some embodiments of the present disclosure. The EUVL exposure tool of FIG. 2 includes the exposure device 200 that shows the exposure of photoresist coated substrate, a target semiconductor substrate 210, with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic, such as a reticle, e.g., a reflective mask 205c, with a beam of EUV light, to produce a patterned beam, and one or more reduction projection optics 205d, 205e, for projecting the patterned beam onto the target semiconductor substrate 210. A mechanical assembly (not shown) may be provided for generating a controlled relative movement between the target semiconductor substrate 210 and patterning optic, e.g., a reflective mask 205c. As further shown, the EUVL exposure tool of FIG. 2, further includes the EUV radiation source 100 including a plasma plume 23 at the zone of excitation ZE emitting EUV light in the chamber 105 that is collected and reflected by a collector mirror 110 into the exposure device 200 to irradiate the target semiconductor substrate 210.

Figure 3A:
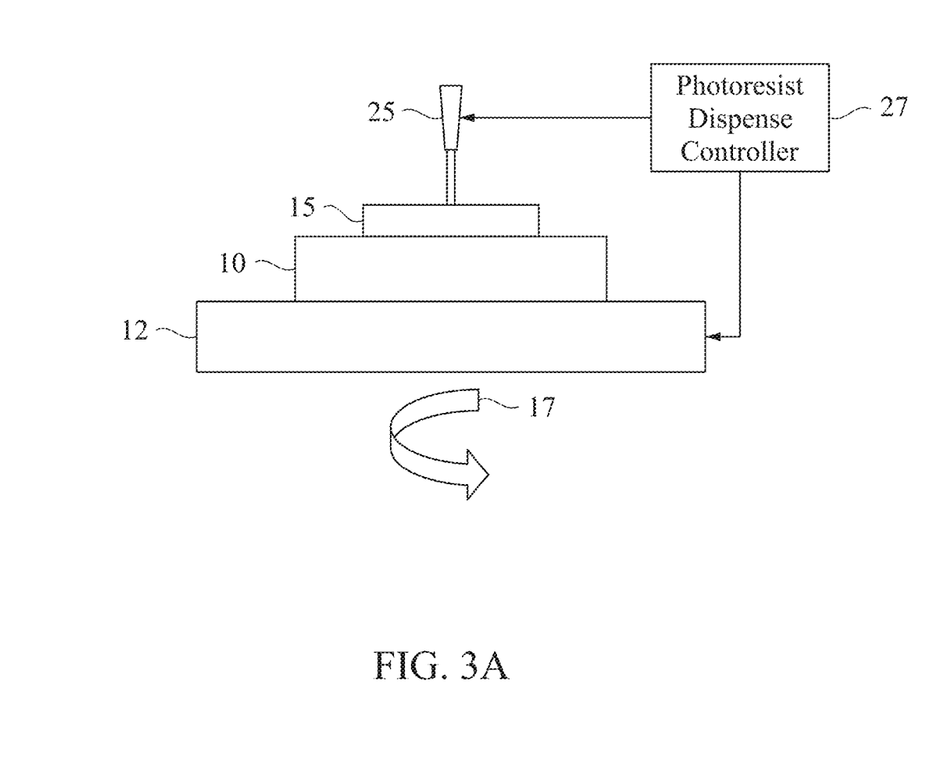
FIGS. 3A and 3B show operations for disposing a photoresist layer on a semiconductor device on a semiconductor substrate in accordance with some embodiments of the present disclosure.
Figure 3B:
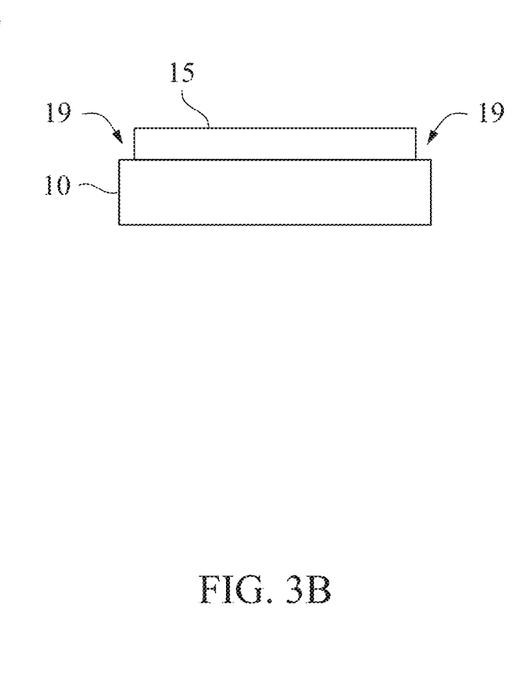

FIGS. 3A and 3B show operations for disposing a photoresist layer on a semiconductor device on a semiconductor substrate in accordance with some embodiments of the present disclosure. A photoresist material is coated on a surface of a semiconductor substrate 10 of the semiconductor device to form a photoresist layer 15 of FIGS. 3A and 3B. The photoresist material is dispensed from a dispenser 25. In some embodiments, a photoresist dispense controller 27 is coupled to the dispenser 25 to control a thickness of the photoresist layer 15 that is produced on the semiconductor substrate 10. In some embodiments, the semiconductor substrate 10 is placed on a stage 12 and the stage 12 is rotating around a rotation direction 17 to uniformly distribute the photoresist material on the semiconductor substrate 10. In some embodiments a protection segment (not shown) is coated in an edge region 19 around an edge of the semiconductor substrate 10 to prevent the photoresist material from spilling over the edge of the semiconductor substrate 10. In some embodiments, the photoresist dispense controller 27 is also coupled to a stage controller (not shown) in the stage 12 to synchronize the dispensing of the photoresist material and the rotation of the semiconductor substrate 10. In some embodiments, the semiconductor substrate 10 including the photoresist layer 15 are baked, in a post application bake (PAB) operation, to drive out solvent in the photoresist material and solidify the photoresist layer 15. In some embodiments, the semiconductor substrate 10 is used for manufacturing a semiconductor device and, thus, includes one or more layers of the semiconductor device below the photoresist layer 15.

In some embodiments, the photoresist layer 15 is a photosensitive layer that is patterned by exposure to actinic radiation. Typically, the chemical properties of the photoresist regions struck by incident radiation change in a manner that depends on the type of photoresist used. The photoresist layer 15 is either a positive tone resist or a negative tone resist. A positive tone resist refers to a photoresist material that when exposed to radiation (typically UV light, e.g., EUV) becomes soluble in a developer, while the region of the photoresist that is non-exposed (or exposed less) is insoluble in the developer. A negative tone resist, on the other hand, refers to a photoresist material that when exposed to radiation becomes insoluble in the developer, while the region of the photoresist that is non-exposed (or exposed less) is soluble in the developer. The region of a negative resist that becomes insoluble upon exposure to radiation may become insoluble due to a cross-linking reaction caused by the exposure to radiation.

Figure 4A:
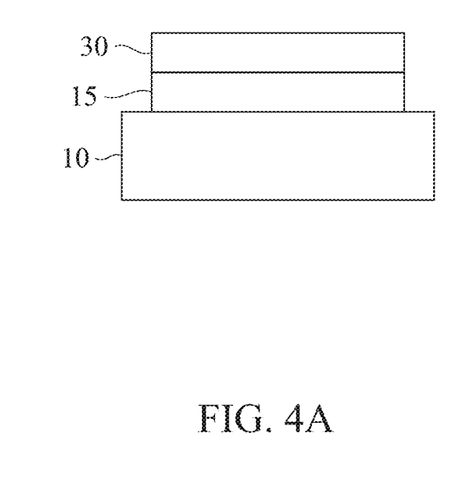
FIGS. 4A and 4B respectively show a semiconductor device and exposing the semiconductor device in accordance with some embodiments of the present disclosure.
Figure 4B:
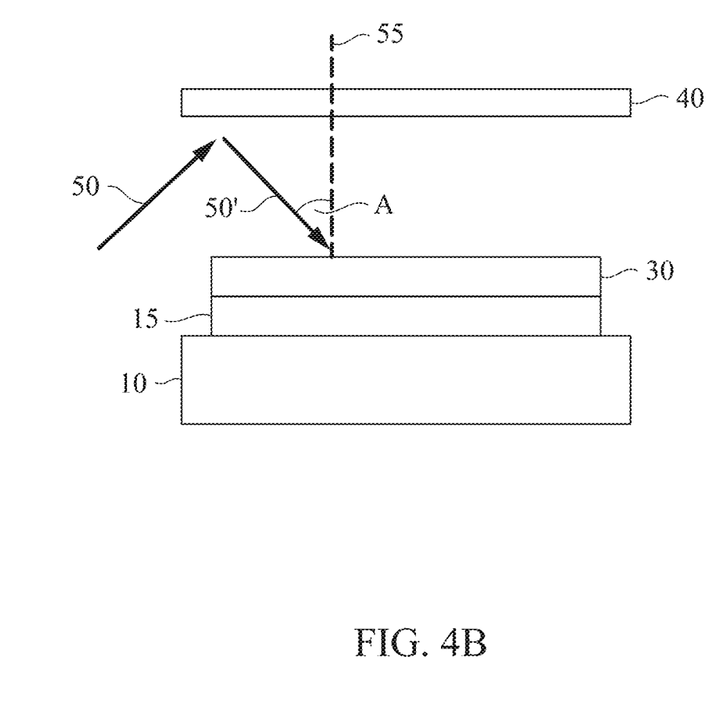

FIGS. 4A and 4B respectively show a semiconductor device and exposing the semiconductor device in accordance with some embodiments of the present disclosure. FIG. 4A shows the semiconductor device of FIG. 3B where a top layer 30 is disposed on top of the photoresist layer 15 that is disposed on the semiconductor substrate 10. The top layer 30 may be disposed after the semiconductor substrate 10 including the photoresist layer 15 are baked to solidify the photoresist layer 15.

In some embodiments, the top layer 30 has a thickness between about 20 nm and about 100 nm, e.g., 30 nm or 50 nm, and the top layer 30 includes a material that is substantially opaque to the DUV radiation, e.g., for the DUV radiation with wavelengths in the range 190 nm to 365 nm. Also, the top layer 30 is transparent to EUV radiation, e.g., for the EUV radiation with wavelengths in the range 10 nm to 20 nm, e.g., 13.5 nm. In some embodiments, the top layer 30 is opaque to the DUV radiation when a transmission of the top layer for the DUV radiation is less than about 5 percent, e.g., less than about 2 percent. In some embodiments, the top layer 30 is transparent to the EUV radiation when a transmission of the top layer for the EUV radiation is more than about 90 percent, e.g., more than about 95 percent. In some embodiments, the top layer 30 is a poly-silicon layer or includes poly-silicon material. In some embodiments, the top layer 30 is a poly-silicon layer with a thickness between 30 nm and 50 nm. Other materials that may be used for the top layer that substantially attenuate the DUV radiation but do not attenuate the EUV radiation include materials having a fluorinated polymer and materials having a benzene-ring structure.

In some embodiments, the thickness of the top layer 30 is selected such that the top layer 30 does not transmit the DUV radiation but transmits the EUV radiation. In some embodiments, a wavelength W of the DUV radiation is selected and the thickness D of the top layer 30 is determined, e.g., calculated, based on the wavelength W such that DUV radiation at and around the wavelength W is significantly blocked, e.g., is reflected, by the top layer 30. However, the EUV radiation is transmitted through the top layer 30. In some embodiments, the wavelength W is in the range 190 nm to 365 nm. In some embodiments, when the radiation from an EUV radiation source, e.g., the EUV radiation source 100 of FIG. 1, is perpendicular to the semiconductor substrate 10, the thickness D is determined based on equation (2) below, where m is either zero or a positive integer.

$$D = (2m+1)W/4 \quad \text{equation (2)}$$

FIG. 4B shows the device of FIG. 4A that includes the top layer 30 that is disposed on top of the photoresist layer 15 that is disposed on the semiconductor substrate 10. FIG. 4B also shows a radiation 50 that is originated from an EUV light source, e.g., EUV light source 100 of FIG. 1. The radiation 50 is directed to the reflective photomask 40 where the radiation 50' is reflected from the reflective photomask 40 and is incident into the top layer 30. The incident angle of the radiation 50', which is defined with respect to a line 55 that is perpendicular to a top surface of the top layer 30 is angle A. As described, the radiation 50 includes both the EUV radiation and the DUV radiation. The radiation 50' also includes both the EUV radiation and the DUV radiation. As shown in FIG. 4B, radiation 50' passes through the top layer 30 before reaching the photoresist layer 15. Thus, as discussed above, the top layer 30 significantly reduces the DUV radiation but does not significantly change the EUV radiation. In some embodiments, when the incident angle of the radiation 50' is A, the thickness D is determined based on equation (3) below, where m is either zero or a positive integer.

$$D = (2m+1)\cos(A)W/4 \quad \text{equation (3)}$$

Thus, the top layer 30 having the thickness D significantly blocks the DUV radiation at and around the wavelength W. In some embodiments, as discussed above, a percentage of the DUV radiation to the EUV radiation increases in the radiation 50' compared to the radiation 50 when the reflective mask includes a pellicle (not shown) over the mask because the pellicle reflects the DUV radiation more than the EUV radiation. In addition, the reflective photomask 40 that is designed for the EUV radiation may exhibit comparable reflectance for the multiple reflective layers compared to the absorption layer for the DUV radiation. Thus, in some embodiments, the DUV may generate, e.g., induce, a varying absorbed energy bias on the photoresist layer 15. In addition, the photoresist material, positive tone or negative tone, is considered fully exposed when the energy delivered by the EUV radiation and the DUV radiation to the photoresist material, e.g., to a unit area of the photoresist material, exceeds a threshold energy level. Thus, in some embodiments, when the top layer 30 is not used, the DUV radiation may broaden the fully exposed regions and change the CD of the layout pattern on the photoresist material. In some embodiments, in a positive tone photoresist material, broadening the exposed portions increases the CD of the layout pattern and in a negative tone photoresist material broadening the exposed portions, shrinks the CD of the layout pattern. In some embodiments, the top layer 30 is formed as a membrane with the thickness D of a material transparent to EUV as discussed below, and the membrane is placed on the photoresist layer 15.

Figure 5:
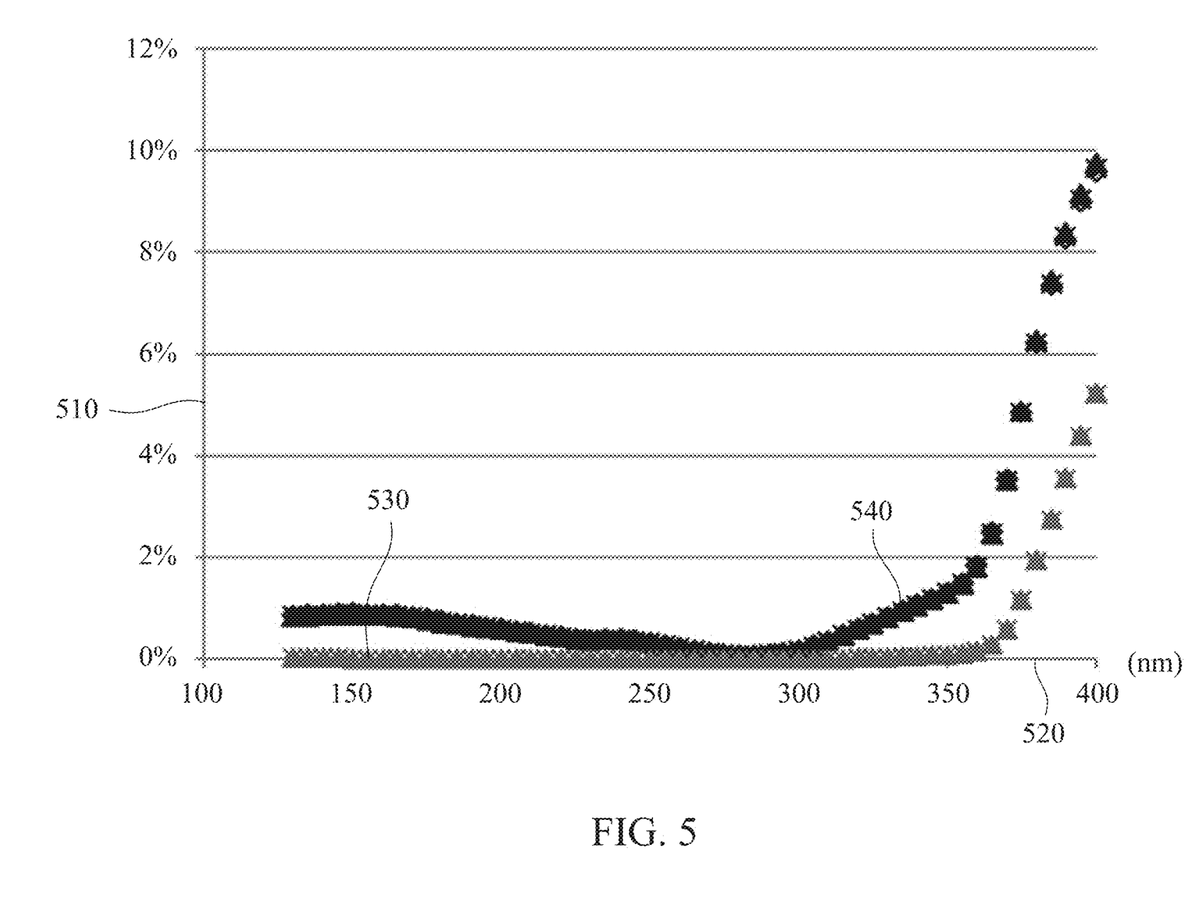
FIG. 5 shows a transmission variation of poly-silicon with respect to wavelength in accordance with some embodiments of the present disclosure.

FIG. 5 shows a transmission variation of poly-silicon with respect to wavelength in accordance with some embodiments of the present disclosure. The transmission percentage is shown on coordinate 510 and the wavelength is shown on coordinate 520. A curve 540 shows percentage ratios of the transmitted energy over the incident energy through 30 nm of poly-silicon versus wavelength. As shown, the percentage of the energy transmitted through 30 nm of poly-silicon is less than 2 percent for the DUV radiation in the wavelength range of 150 nm to 365 nm. In addition, the percentage ratio for the EUV radiation of wavelength 13.5 nm through 30 nm of poly-silicon is 95 percent. Thus, at least 98 percent of the DUV radiation is absorbed by the top layer 30 having a thickness of 50 nm and is prevented from reaching the photoresist layer 15 while 5 percent of the EUV radiation is prevented by the top layer 30 from reaching the photoresist layer 15.

A curve 530 shows percentage ratios of the transmitted energy over the incident energy through 50 nm of poly-silicon versus wavelength. As shown, the percentage of the energy transmitted through 50 nm of poly-silicon is less than 0.5 percent for the DUV radiation in the wavelength range of 150 nm to 365 nm. In addition, the percentage ratio for the EUV radiation of wavelength 13.5 nm through 50 nm of poly-silicon is 92 percent. Thus, at least 99.5 percent of the DUV radiation is prevented by the top layer 30 having a thickness of 50 nm from reaching the photoresist layer 15 while 8 percent of the EUV radiation is prevented by the top layer 30 from reaching the photoresist layer 15.

Figure 6:
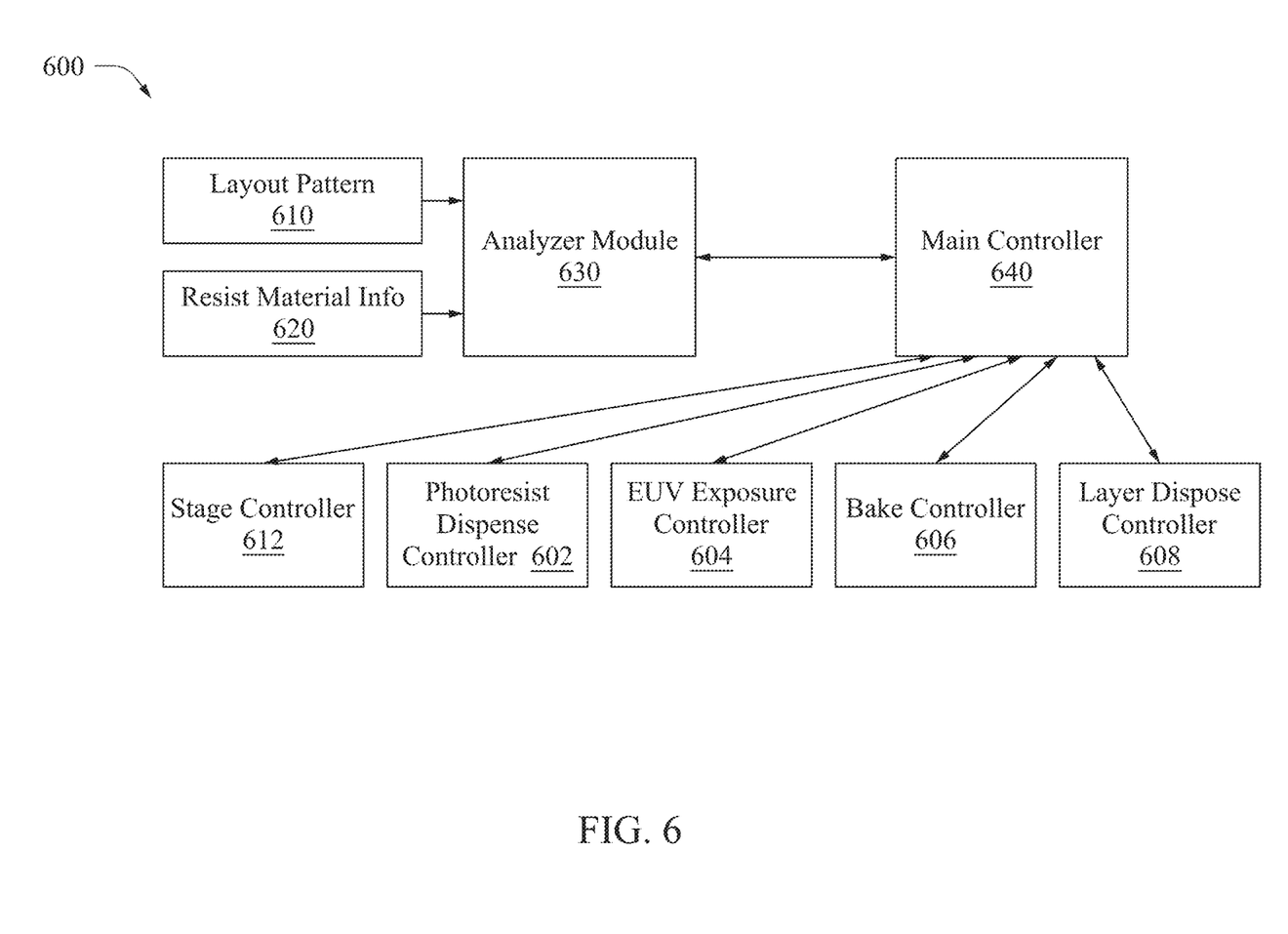
FIG. 6 shows a control system for controlling an exposure of a photoresist layer on a substrate to generate a layout pattern in accordance with some embodiments of the present disclosure.

FIG. 6 shows a control system for controlling an exposure of a photoresist layer on a substrate to generate a layout pattern in accordance with some embodiments of the present disclosure. The control system 600 includes an analyzer module 630 and a main controller 640 coupled to each other. The analyzer module 630 receives a layout pattern 610 to be generated on a photoresist material on a wafer. The analyzer module 630 also receives information of the photoresist material, e.g., the photoresist material information 620. The analyzer may extract, from the photoresist material information 620, a type of the photoresist material such as a positive tone photoresist material or a negative tone photoresist material and an energy density that should be delivered to the photoresist material to fully expose the photoresist material.

In some embodiments, the main controller 640 is coupled to a photoresist dispense controller 602, an EUV exposure controller 604, a bake controller 606, a layer dispose controller 608, and a stage controller 612. In some embodiments and returning back to FIG. 3A, the photoresist dispense controller 602 is consistent with the photoresist dispense controller 27 and the stage controller 612 is included in the stage 12. In some embodiments, the analyzer module 630 determines, based on the resist material info 620, a specific thickness of the photoresist layer 15. The analyzer module 630 commands the stage controller 612 and the photoresist dispense controller 602 through the main controller 640 to deposit a uniform photoresist layer 15 with the specific thickness on the semiconductor substrate 10.

In some embodiments, the analyzer module 630 determines, based on the resist material info 620, an amount of time and temperature to heat the substrate, e.g., for the PAB operation. The analyzer module 630 commands the bake controller 606 through the main controller 640 to perform the PAB operation. In some embodiments, the analyzer module 630 determines, based on the resist material info 620 and the layout pattern 610, an amount of energy to fully expose the photoresist material to produce the layout pattern in the photoresist material. The analyzer module 630 commands the EUV exposure controller 604 through the main controller 640 to turn on the EUV light source 100 to expose the photoresist layer 15 to the EUV radiation. In some embodiments, the EUV exposure controller 604 controls the generation of laser pulses that produces the EUV radiation. In some embodiments, the EUV exposure controller 604 controls a shutter between EUV light source 100 and exposure device 200 and by opening the shutter allows the EUV radiation to expose the photoresist layer 15.

In some embodiments, the analyzer module 630 receives the information of the DUV radiation produced by the EUV light source 100 from the EUV exposure controller 604 via the main controller 640. Based on the information of the DUV radiation, the analyzer module 630 determines a specific thickness and material of the top layer 30 that may be deposited on the photoresist layer 15. In some embodiments, the analyzer module 630 sends a command through the main controller 640 to the layer dispose controller 608 to deposit the top layer 30 with the specific thickness and material over the photoresist layer 15. In some embodiments, the analyzer module 630 receives online information of a thickness of a layer, e.g., the top layer 30, that is being disposed on the substrate, via the main controller 640, from the layer dispose controller 608. When the analyzer module 630 determines that the top layer 30 with the specific thickness is deposited, the analyzer module 630 may send a command through the main controller 640 to the layer dispose controller 608 to stop depositing the top layer 30. In some embodiments, the analyzer module 630 selects, e.g., determines, a wavelength of the out-of-band DUV radiation and then determines the thickness of the top layer 30 based on equations (2) or (3) and transmits the thickness to the layer dispose controller 608 to deposit the top layer 30 with the determined thickness.

Figure 7:
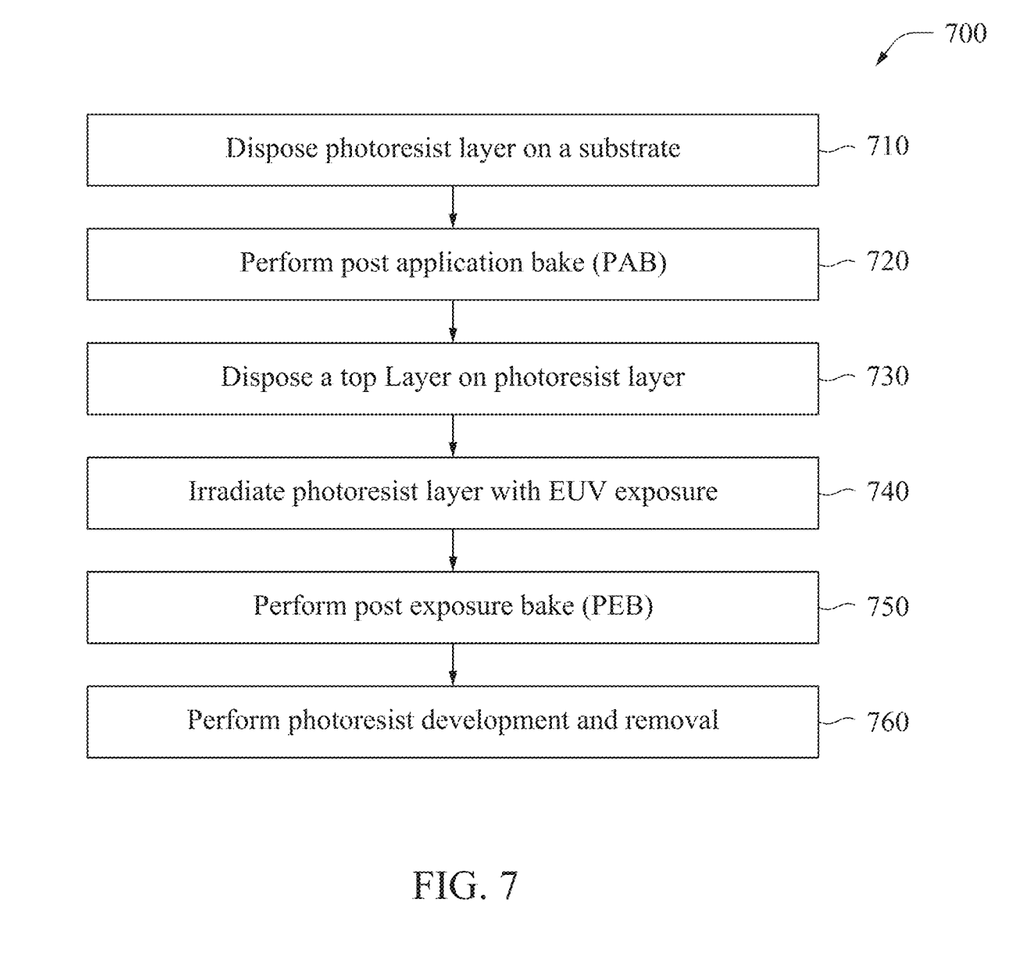
FIG. 7 illustrates a flow diagram of an exemplary process for controlling an exposure of a photoresist layer on a substrate in accordance with some embodiments of the present disclosure.

FIG. 7 illustrates a flow diagram of an exemplary process 700 for controlling an exposure of a photoresist layer on a substrate in accordance with some embodiments of the present disclosure. In some embodiments, the process 700 is performed by the control system 600 of FIG. 6 or the computer system 800 of FIGS. 8A and 8B. In operation 710, a photoresist layer is disposed on a semiconductor substrate. As shown in FIG. 3A, the photoresist layer 15 is disposed by the dispenser 25 on the semiconductor substrate 10 when the semiconductor substrate 10 is on the stage 12 and the stage 12 is rotating around the rotation direction 17. In some embodiments, the stage 12 rotates around a direction opposite to the rotation direction 17.

At operation 720, a post application bake (PAB) operation is performed. As discussed, the semiconductor substrate 10 including the photoresist layer 15 are baked to drive out solvent in the photoresist material and solidify the photoresist layer 15 such that the top layer 30 may be disposed on the photoresist layer 15.

At operation 730, a top layer is disposed, e.g., placed, on the photoresist layer. As shown in FIGS. 4A and 4B, the top layer 30 is disposed on the photoresist layer 15. In some embodiments, the top layer 30 is a membrane that includes a 30 nm to 50 nm thick poly-silicon layer deposited on a 3 nm to 5 nm thick silicon nitride layer. In some embodiments, the top layer 30 is formed in three steps. In step 1, a thin layer, e.g., 3 nm to 5 nm of silicon nitride is deposited on a substrate, e.g., a silicon substrate of about 500 micron thickness. In some embodiments, the silicon nitride layer is an etch stop layer. In step 2, a layer of poly-silicon having a thickness between 30 nm to 50 nm is deposited on top of the silicon nitride layer. In step 3, a back side etching is performed on the back side of the substrate until the etch stop layer is reached and a membrane, e.g., a thin layer of poly-silicon on silicon nitride is formed. In some embodiments, after the membrane is formed and before the photoresist layer 15 is exposed to the EUV exposure, the membrane is placed on the photoresist layer 15. In some embodiments, the substrate with the silicon nitride layer and the polysilicon layer disposed thereon is placed on the photoresist layer 15 with the poly-silicon layer facing the photoresist layer 15 and then the substrate and the etch stop layer are removed by etching. In some embodiments, the formed membrane has a diameter between 0.5 centimeters to 3 centimeters, e.g., 1 centimeter.

At operation 740, the photoresist layer is irradiated with the EUV radiation. As discussed, the photoresist layer 15 is irradiated by the EUV radiation from an EUV light source, e.g., the EUV light source 100 of FIG. 1. As shown in FIG. 4B, the photoresist layer 15 is irradiated through the top layer 30. As discussed, the top layer 30 is disposed such that the DUV radiation of the EUV light source 100 is significantly removed by the top layer 30 either through absorption or through reflection.

At operation 750, a post exposure bake operation (PEB) is performed and at operation 760 the photoresist material of the photoresist layer 15 is developed and removed. In some embodiments, before the post exposure bake operation, the top layer 30, e.g., the membrane, is removed from the photoresist layer 15. For a positive tone photoresist material, the exposed regions are developed by applying a developer solution and then is removed. For a negative tone photoresist material, the non-exposed regions are developed by applying a developer solution and is subsequently removed.

Figure 8A:
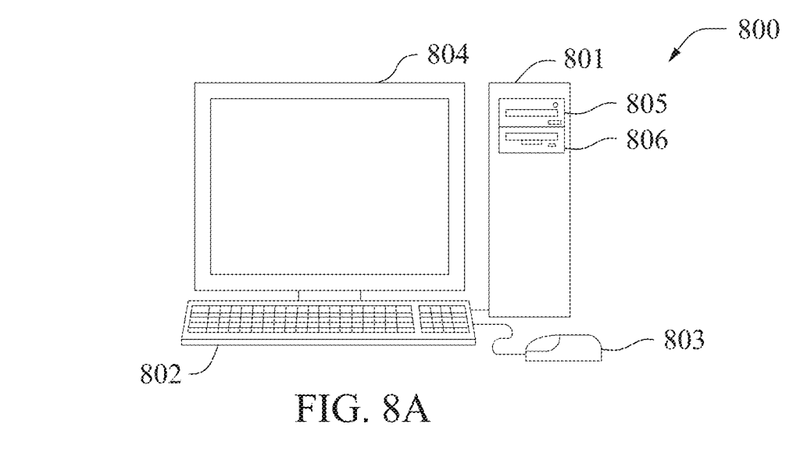
FIGS. 8A and 8B illustrate an apparatus for controlling an exposure of a photoresist layer on a substrate in accordance with some embodiments of the present disclosure.
Figure 8B:
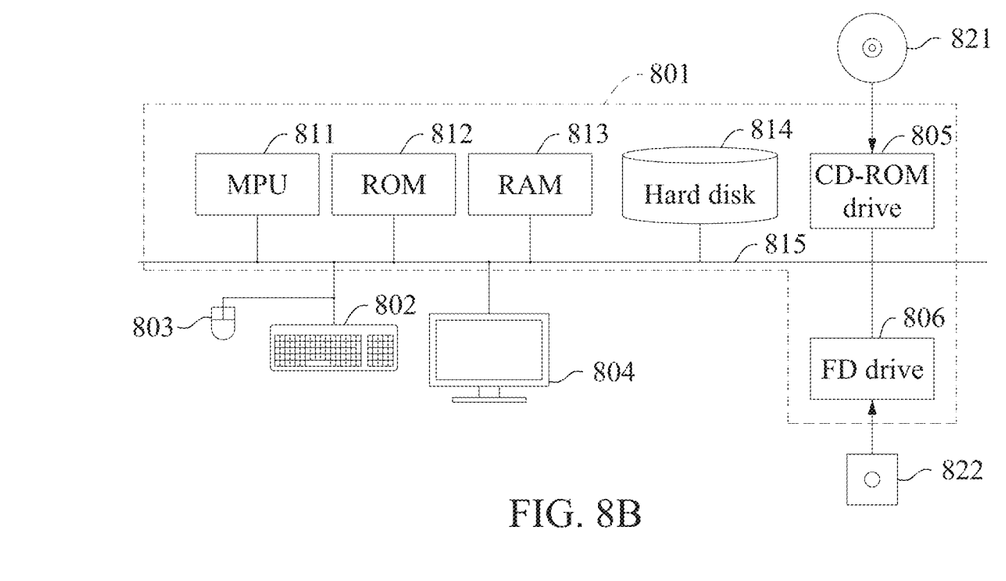

FIGS. 8A and 8B illustrate an apparatus for controlling an exposure of a photoresist layer on a substrate in accordance with some embodiments of the present disclosure. In some embodiments, the computer system 800 is used for performing the functions of the modules of FIG. 6 that include the main controller 640, the analyzer module 630, the stage controller 612, photoresist dispense controller 602, the EUV exposure controller 604, the bake controller 606, and the layer dispose controller 608. In some embodiments, the computer system 800 is used to execute the process 700 of FIG. 7. In some embodiments, the computer system 800 determines, e.g., calculates, a thickness of the top layer 30. Also, the computer system 800 controls the deposition of the photoresist layer and the deposition of the top layer. In addition, the computer system 800 controls heating the substrate and exposing the substrate to EUV exposure.

FIG. 8A is a schematic view of a computer system that performs the functions of an apparatus for controlling an exposure of a photoresist layer on a substrate. All of or a part of the processes, method and/or operations of the foregoing embodiments can be realized using computer hardware and computer programs executed thereon. In FIG. 8A, a computer system 800 is provided with a computer 801 including an optical disk read only memory (e.g., CD-ROM or DVD-ROM) drive 805 and a magnetic disk drive 806, a keyboard 802, a mouse 803, and a monitor 804.

FIG. 8B is a diagram showing an internal configuration of the computer system 800. In FIG. 8B, the computer 801 is provided with, in addition to the optical disk drive 805 and the magnetic disk drive 806, one or more processors 811, such as a micro processing unit (VIPU), a ROM 812 in which a program such as a boot up program is stored, a random access memory (RAM) 813 that is connected to the MPU 811 and in which a command of an application program is temporarily stored and a temporary storage area is provided, a hard disk 814 in which an application program, a system program, and data are stored, and a bus 815 that connects the MPU 811, the ROM 812, and the like. Note that the computer 801 may include a network card (not shown) for providing a connection to a LAN.

The program for causing the computer system 800 to execute the functions of the control system for controlling an exposure of a photoresist layer on a substrate in the foregoing embodiments may be stored in an optical disk 821 or a magnetic disk 822, which are inserted into the optical disk drive 805 or the magnetic disk drive 806, and transmitted to the hard disk 814. Alternatively, the program may be transmitted via a network (not shown) to the computer 801 and stored in the hard disk 814. At the time of execution, the program is loaded into the RAM 813. The program may be loaded from the optical disk 821 or the magnetic disk 822, or directly from a network. The program does not necessarily have to include, for example, an operating system (OS) or a third party program to cause the computer 801 to execute the functions of the control system for controlling an amount of energy delivered by an electron beam to a resist material in the foregoing embodiments. The program may only include a command portion to call an appropriate function (module) in a controlled mode and obtain desired results.

As discussed, the embodiments above prevent DUV radiation from reaching the photoresist layer 15 and prevent a blurred exposure of the layout pattern on the photoresist layer 15 and, thus, generate a uniform CD for the layout pattern. In addition, a broadening of the exposed areas to the neighboring areas for the fully exposed features is reduced. Also, there is no appreciable loss of the EUV radiation.

According to some embodiments of the present disclosure, a method of generating a layout pattern on a photoresist material includes disposing a photoresist layer of a resist material on a substrate. The method also includes disposing a top layer over of the photoresist layer. The top layer is transparent for extreme ultraviolet (EUV) radiation the top layer is opaque for deep ultraviolet (DUV) radiation. The method further includes irradiating the photoresist layer with radiation generated from an EUV radiation source, wherein the radiation is configured to pass through the top layer to expose the photoresist layer. In an embodiment, the top layer includes a first surface in contact with the photoresist layer and an exposed second surface on top of the first surface. The radiation enters the top layer from the exposed second surface, passes through the top layer, and exposes the photoresist layer after exiting the top layer through the first surface. In an embodiment, the method further includes irradiating the photoresist layer with the radiation including EUV radiation having a wavelength between 10 nm and 100 nm and DUV radiation in a wavelength range of 190 nm to 365 nm. In an embodiment, the method further includes heating the photoresist layer in a post-application baking operation prior to disposing the top layer over of the photoresist layer. In an embodiment, the disposing the top layer includes disposing a poly-silicon layer over of the photoresist layer. In an embodiment, the resist material of the photoresist layer is a negative tone resist material. The irradiating the photoresist layer further includes imaging the layout pattern into the photoresist layer to expose a first portion of the photoresist layer to the radiation and the method also includes applying a developer to dissolve and remove an un-exposed second portion of the photoresist layer and a portion of the top layer over the second portion of the photoresist layer while not removing the first portion of the photoresist layer. In an embodiment, the resist material of the photoresist layer is a positive tone resist material. The irradiating the photoresist layer further comprises imaging the layout pattern into the photoresist layer to expose a first portion of the photoresist layer to the radiation and the method also includes applying a developer to dissolve and remove the exposed first portion of the photoresist layer and a portion of the top layer over the first portion of the photoresist layer while not removing an un-exposed second portion of the photoresist layer. In an embodiment, the irradiating the photoresist layer with the radiation from the EUV radiation source includes reflecting the radiation from a reflective mask that includes the layout pattern. The method further includes generating the layout pattern in the photoresist layer after exposing the photoresist layer by the radiation. In an embodiment, the method further includes disposing one or more other layers transparent to the EUV radiation either over of the top layer, or between the top layer and the photoresist layer, wherein one of the one or more other layers is a protective layer.

According to some embodiments of the present disclosure, a method of generating a layout pattern on a photoresist material includes disposing a photoresist layer of a resist material on a substrate. The method also includes selecting a wavelength of an out-of-band DUV radiation of an EUV radiation source. The method includes determining a first thickness of a top layer based on the selected wavelength. The first thickness of the top layer makes the top layer opaque to the selected wavelength of the DUV radiation and makes the top layer transparent to the EUV radiation. The method also includes disposing the top layer having the first thickness over of the photoresist layer and irradiating the photoresist layer with radiation generated from the EUV radiation source. The radiation passes through the top layer to expose the photoresist layer. In an embodiments, the top layer includes a first surface in contact with the photoresist layer and an exposed second surface on top of the first surface. The radiation enters the top layer from the exposed second surface, passes through the top layer, and exposes the photoresist layer after exiting the top layer through the first surface. In an embodiment, the irradiating the photoresist layer with the radiation from the EUV radiation source includes reflecting the radiation from a reflective mask that includes the layout pattern. The method further includes generating the layout pattern in the photoresist layer after exposing the photoresist layer by the radiation. In an embodiment, the method further includes irradiating the photoresist layer with the radiation including EUV radiation having a wavelength between 10 nm and 100 nm and DUV radiation in a wavelength range of 190 nm to 365 nm. In an embodiment, the method further includes heating the photoresist layer in a post-application baking operation prior to disposing the top layer over of the photoresist layer.

According to some embodiments of the present disclosure, a control system for generating a layout pattern on a photoresist material includes a main controller and an analyzer module coupled to the main controller. The analyzer module receives a layout pattern and information of the photoresist material. The layout pattern is produced by radiation from an EUV radiation source in the photoresist material on a wafer. The analyzer module select a wavelength of an out-of-band DUV radiation of the EUV radiation source and determines a first thickness of a top layer based on the selected wavelength. The first thickness of the top layer makes the top layer opaque for the selected wavelength of the DUV radiation and makes the top layer transparent for the EUV radiation. Also, the main controller disposes a photoresist layer of a photoresist material on a semiconductor substrate, disposes the top layer having the first thickness over of the photoresist layer, and irradiate the photoresist layer with radiation generated from the EUV radiation source. The radiation passes through the top layer to expose the photoresist layer. In an embodiment, the control system further includes a photoresist dispense controller coupled to the main controller and a stage controller coupled to the main controller and to rotate the semiconductor substrate on the stage. The photoresist dispense controller and the stage controller disposes the photoresist layer with a uniform thickness on the semiconductor substrate. In an embodiment, the control system further includes a layer dispose controller coupled to the main controller. The layer dispose controller disposes the top layer with the first thickness on top of the photoresist layer. In an embodiment, the control system further includes an EUV exposure controller coupled to the main controller. The EUV exposure controller irradiates the photoresist layer with radiation generated from the EUV radiation source. In an embodiment, the control system further includes a bake controller coupled to the main controller. The bake controller heats the photoresist layer in a post-application baking operation prior to disposing the top layer over of the photoresist layer. In an embodiment, the selected wavelength of the out-of-band DUV radiation of the EUV radiation source is a wavelength from a range of 190 nm to 350 nm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A control system for generating a layout pattern on a photoresist material, comprising:
   a main controller; and
   an analyzer module coupled to the main controller, wherein the analyzer module is configured to receive a layout pattern and information of the photoresist material, wherein the layout pattern is produced by radiation from an extreme ultraviolet (EUV) radiation source in the photoresist material on a wafer, and wherein the analyzer module is configured to:
      select a wavelength of an out-of-band deep ultraviolet (DUV) radiation of the EUV radiation source;
      determine a first thickness of a top layer based on the selected wavelength, the first thickness of the top layer is configured to make the top layer opaque for the selected wavelength of the DUV radiation and to make the top layer transparent for EUV radiation;
   wherein the main controller is configured to:
      control the disposing a photoresist layer of a photoresist material on a semiconductor substrate;

control the disposing the top layer having the first thickness over of the photoresist layer; and
control the irradiating the photoresist layer with radiation generated from the EUV radiation source, wherein the radiation is configured to pass through the top layer to expose the photoresist layer.

2. The control system of claim 1, further comprising:
a photoresist dispense controller coupled to the main controller; and a stage controller coupled to the main controller and configured to rotate the semiconductor substrate on the stage,
wherein the photoresist dispense controller and the stage controller are configured to dispose the photoresist layer with a uniform thickness on the semiconductor substrate.

3. The control system of claim 2, further comprising:
a layer dispose controller coupled to the main controller;
and wherein the layer dispose controller is configured to dispose the top layer with the first thickness on top of the photoresist layer.

4. The control system of claim 1, further comprising:
an EUV exposure controller coupled to the main controller;
and wherein the EUV exposure controller is configured to irradiate the photoresist layer with radiation generated from the EUV radiation source.

5. The control system of claim 1, further comprising:
a bake controller coupled to the main controller;
and wherein the bake controller is configured to heat the photoresist layer in a post-application baking operation prior to disposing the top layer over of the photoresist layer.

6. The control system of claim 1, wherein the selected wavelength of the out-of-band DUV radiation of the EUV radiation source is a wavelength from a range of 190 nm to 350 nm.

7. A control system for generating a layout pattern on a photoresist layer, comprising:
a main controller, wherein the main controller is configured to receive a layout pattern wherein the layout pattern is produced by radiation from an extreme ultraviolet (EUVA radiation source in the photoresist layer on a semiconductor substrate, and the main controller is configured to:
select a wavelength of an out-of-band deep ultraviolet (DUV) radiation of the EUV radiation source;
determine a first thickness of a top layer to be disposed on the photoresist layer based on the selected wavelength, the first thickness of the top layer is configured to make the top layer opaque for the selected wavelength of the DUV radiation and to make the top layer transparent to EUV radiation;
wherein the main controller is configured to:
control disposing the photoresist layer on the semiconductor substrate;
control baking the photoresist layer in a post application bake (PAB) operation;
control disposing the top layer having the first thickness over of the photoresist layer; and
control irradiating the photoresist layer with radiation generated from the EUV radiation source, wherein the radiation is configured to pass through the top layer to expose the photoresist layer.

8. The control system of claim 7, wherein the top layer comprises a first surface in contact with the photoresist layer and an exposed second surface on top of the first surface, and wherein the radiation is configured to enter the top layer from the exposed second surface, pass through the top first layer, and expose the photoresist layer after exiting the top layer through the first surface.

9. The control system of claim 7, wherein the EUV radiation has a wavelength between 10 nm and 100 nm and DUV radiation in a wavelength range of 190 nm to 365 nm.

10. The control system of claim 9, wherein a first wavelength is selected in the wavelength range of 190 nm to 365 nm.

11. The control system of claim 7, wherein the top layer comprises:
a membrane comprising a poly-silicon layer deposited over a silicon nitride layer, and wherein the membrane is configured to be placed over the photoresist layer.

12. The control system of claim 7, wherein the main controller is further configured to:
control irradiating the photoresist layer with the radiation from the EUV radiation source that is reflected from a reflective mask; and
control generating a pattern in the photoresist layer after exposing the photoresist layer by the EUV radiation.

13. The control system of claim 7, wherein the main controller is further configured to:
control disposing one or more other layers transparent to the EUV radiation either:
over the top layer, or
between the top layer and the photoresist layer, wherein one of the one or more other layers is a protective layer.

14. The control system of claim 7, wherein the main controller is further configured to select the first thickness as a multiple of a rational fraction of the selected wavelength.

15. A control system for generating a layout pattern on a photoresist layer, comprising:
a main controller configured to receive a layout pattern wherein the layout pattern is produced by radiation from an extreme ultraviolet (EUV) radiation source in the photoresist layer on a semiconductor substrate, and the main controller is further configured to:
select a wavelength of an out-of-band deep ultraviolet (DUV) radiation of the EUV radiation source;
determine a first thickness of a top layer to be disposed on the photoresist layer as a multiple of a rational fraction of the selected wavelength, the first thickness of the top layer is configured to make the top layer opaque for the selected wavelength of the DUV radiation and to make the top layer transparent to EUV radiation;
wherein the main controller is also configured to:
control disposing the photoresist layer on the semiconductor substrate; and
control disposing the top layer having the first thickness over of the photoresist layer.

16. The control system of claim 15, wherein the main controller is further configured to:
control baking the photoresist layer in a post application bake (PAB) operation prior to disposing the top layer.

17. The control system of claim 16, wherein the main controller is further configured to:
control irradiating the photoresist layer with radiation generated from the EUV radiation source, wherein the radiation is configured to pass through the top layer to expose the photoresist layer.

18. The control system of claim 16, wherein the main controller is further configured to:
control removing the top layer; and control applying a developer to the photoresist layer to produce a patterned layer over the semiconductor substrate.

19. The control system of claim 15, wherein the EUV radiation has a wavelength between 10 nm and 100 nm.

20. The control system of claim 15, wherein a first out-of-band DUV radiation wavelength is selected in a wavelength range of 190 nm to 365 nm.

* * * * *